(12) United States Patent
Heinrich et al.

(10) Patent No.: US 8,506,773 B2
(45) Date of Patent: Aug. 13, 2013

(54) DRIVE END-BLOCK FOR A ROTATABLE MAGNETRON

(75) Inventors: Hans-Juergen Heinrich, Grossroehrsdorf (DE); Sven Haehne, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 382 days.

(21) Appl. No.: 12/504,776

(22) Filed: Jul. 17, 2009

(65) Prior Publication Data
US 2010/0012487 A1 Jan. 21, 2010

(30) Foreign Application Priority Data
Jul. 18, 2008 (DE) .......... 10 2008 033 904

(51) Int. Cl.
*C23C 14/34* (2006.01)
(52) U.S. Cl.
USPC ................. 204/298.21; 204/298.22
(58) Field of Classification Search
USPC ...................... 204/298.21, 298.22
See application file for complete search history.

(56) References Cited

U.S. PATENT DOCUMENTS

| 4,374,722 | A | 2/1983 | Zega |
| 5,096,562 | A * | 3/1992 | Boozenny et al. ....... 204/298.22 |
| 5,490,913 | A | 2/1996 | Schertler et al. |
| 6,736,948 | B2 * | 5/2004 | Barrett ..................... 204/298.22 |
| 2003/0136672 | A1 | 7/2003 | Barrett |
| 2006/0000705 | A1 | 1/2006 | Hartig et al. |
| 2006/0157346 | A1 | 7/2006 | Cnockaert |
| 2008/0105543 | A1 * | 5/2008 | Dellaert et al. .......... 204/298.15 |

FOREIGN PATENT DOCUMENTS

| DE | 4405747 A1 | 11/1994 |
| DE | 202005008801 U1 | 8/2005 |
| JP | 2008-069402 | * 3/2008 |
| WO | 2005005682 A1 | 1/2005 |
| WO | 2006007504 A1 | 1/2006 |

OTHER PUBLICATIONS
Machine Translation JP 2008-69402 dated Mar. 27, 2008.*

* cited by examiner

*Primary Examiner* — Rodney McDonald
(74) *Attorney, Agent, or Firm* — Heslin Rothenberg Farley & Mesiti P.C.

(57) ABSTRACT

A drive end block for a magnetron arrangement with a rotating target, comprises an end block housing having a rotatably mounted drive shaft. The drive shaft is arranged in the end block housing, accessible at an end from outside of the end block housing for connection to the rotating target, and adapted at its end inside the end block housing for introduction of a torque. An electric motor with a stator and a rotor for creating the torque is arranged inside the end block housing.

13 Claims, 2 Drawing Sheets

DRIVE END-BLOCK FOR A ROTATABLE MAGNETRON

CROSS REFERENCE TO RELATED APPLICATION

Figure 1:
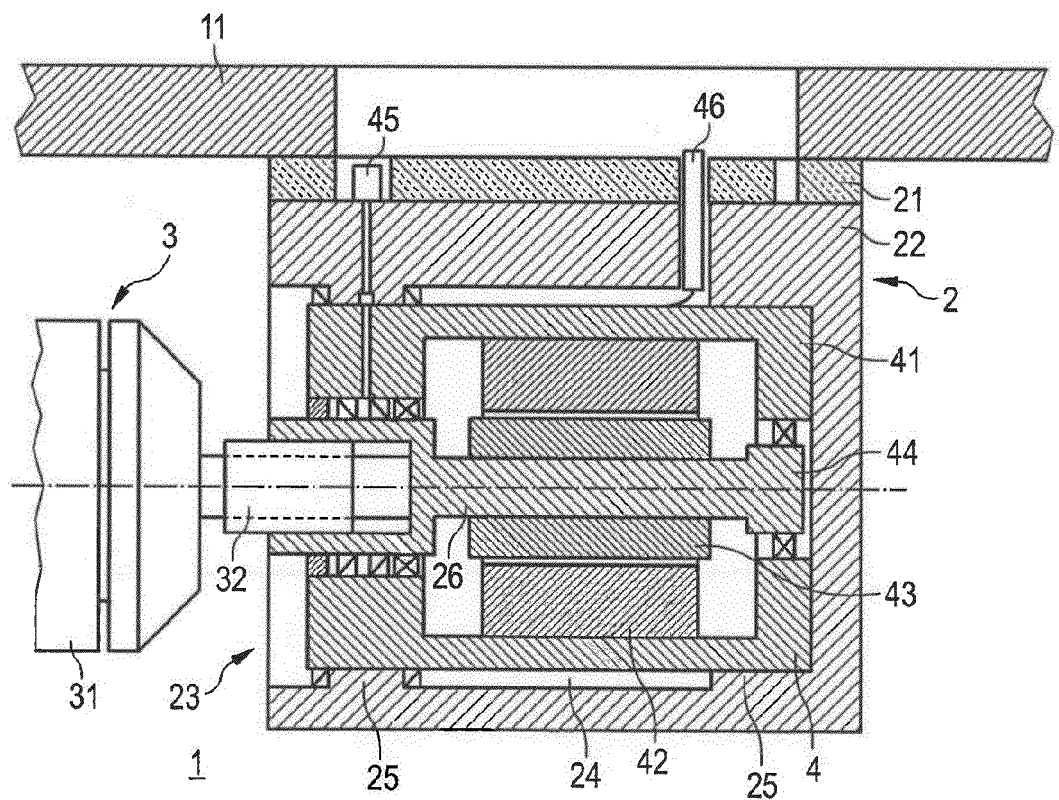

This application claims priority of German application 10 2008 033 904.0 filed on Jul. 18, 2008, the entire contents of which is hereby incorporated herein by reference.

BACKGROUND ART

A drive end block for a magnetron arrangement with a rotating target that has a simple design and is easy to maintain is described hereafter.

Magnetron arrangements with a rotating target are known in vacuum coating technology. With these magnetron arrangements, a target, usually tubular, surrounds a magnetic arrangement, such that the tubular target is rotatably mounted and drivable so that the target material is worn away uniformly. The tubular target is usually mounted between two end blocks in the vacuum chamber of a vacuum coating installation, said blocks being designed to allow rotatable mounting of the tubular target. In most cases, different functions are assigned to the two end blocks here. One of the end blocks is usually designed as a supply end block for supplying the magnetron with cooling water and electric power, and the other end block is designed as a drive end block for introducing a torque for creating the rotation of the tubular target.

Known drive end blocks therefore have an electromechanical drive mechanism in the form of an electric motor with gears, which introduces the torque via bevel gears, spur gears or toothed belts, for example. This drive mechanism must be potential-free and therefore must be installed so it is insulated with respect to the target and usually also with respect to the vacuum chamber. Therefore, with known drive end blocks, the drive mechanism is installed in the drive end block using insulators in such a way that the electric motor is usually outside of the vacuum chamber with respect to the atmosphere and a gear or parts of a gear or other torque transmitting mechanisms such as belt drives and the like are arranged inside the drive end block. Depending on the electric process voltage level, the cost of potential isolation can be enormous in order to reliably achieve the result that the process voltage applied to the tubular target does not arc over to the drive mechanism or the vacuum chamber. One example of such an end block is known from European Patent Application EP 1 365 436 A2.

Within the vacuum chamber, the torque is usually transferred from the drive mechanism arranged in the interior of the drive end block to the target in the vacuum chamber via an insulated coupling element. Since the drive end block combines the functions of initiating rotation, providing electric insulation and vacuum sealing, the components of the drive end block must be manufactured and installed with a high precision. Known drive end blocks have a very complex design in general and require a large number of individual parts to protect the seal of the vacuum chamber against the atmosphere and the electric insulation of the components accessible from the outside.

BRIEF SUMMARY OF THE INVENTION

An improved drive end block is therefore to be provided, so that the requirements of the manufacturing tolerances of the components are lower than with known drive end blocks, the drive mechanism being electrically insulated from the parts carrying the process voltage as well as from the vacuum chamber, and the seal of the vacuum chamber being achievable with simpler means and less complexity.

Therefore, a drive end block for a magnetron arrangement with a rotating target is proposed, which comprises an end block housing with a rotatably mounted drive shaft arranged in the end block housing and designed on its end, which is accessible from the outside of the end block housing, for connection to the rotating target and designed on its end, which is inside the end block housing for introduction of a torque, and comprising an electric motor with a stator and a rotor for creating a torque, such that the electric motor is arranged inside the end block housing.

According to one embodiment, the electric motor may be arranged coaxially with the drive shaft and/or the torque may be transmitted directly to the drive shaft.

Direct transfer of torque to the drive shaft should be understood to mean that torque is transferred to the drive shaft without slippage and with the same direction of rotation. This may be achieved, for example, by arranging the motor shaft, on which the rotor sits, concentrically with the drive shaft and connecting it to the drive shaft fixedly or by means of a coupling. In this case, no gear components are needed to transfer the torque created by the electric motor to the drive shaft. The design of the drive end block is greatly simplified in comparison with known approaches. At the same time, this implies that the electric motor is situated inside the end block housing. It is self-evident that the electric motor must be mounted with electric insulation in the end block housing and/or the end block housing itself and/or the motor housing must be made of a material that is not electrically conductive.

According to another embodiment, it is possible to provide for a gear which is designed as a planetary gear, for example, to be arranged between the electric motor and the drive shaft. Planetary gears have a compact design and allow a coaxial arrangement of the motor and the drive shaft. The gear may be connected to the electric motor and/or to the drive shaft via one or each coupling.

In one embodiment, the rotor is arranged directly on the drive shaft, so that the drive shaft at the same time is the motor shaft of the electric motor. In other words, in this case the motor shaft of the electric motor functions as the drive shaft at the same time. This achieves a further simplification because the drive shaft is no longer a separate component that must be installed in the end block housing and because no connection need be established between the drive shaft and the motor shaft to transfer the torque.

In another embodiment, the electric motor is arranged in an auxiliary housing made of a material that is not electrically conductive and the drive shaft is rotatably mounted in the auxiliary housing. As a result of this measure, the cost of electric insulation for the drive shaft is further reduced because the auxiliary housing for the drive shaft acts as an electric insulation element with respect to the end block housing. Again in this case, the drive shaft and the motor shaft may of course also be one and the same component, although this is not obligatorily necessary.

For example, it is possible for the rotor of the electric motor to be arranged directly on the drive shaft, so that the drive shaft is at the same time the motor shaft of the electric motor. The entire drive unit may be designed to be more compact in this way.

A further simplification of the drive unit is obtained when the stator of the electric motor is arranged directly in the auxiliary housing so that the auxiliary housing is the housing of the electric motor at the same time.

In addition, it is possible for the auxiliary housing to be mounted in a twist-proof manner without additional fastening means in receptacles provided for this purpose in the end block housing. This may be accomplished, for example, by providing receptacles in the end block housing having contours that correspond exactly to those of the outside of the auxiliary housing in cross section, so that the electric motor need only be pushed into these receptacles and thus supported in a twist-proof manner. It is self-evident that a circular cross-sectional contour is not suitable for achieving this effect. However, any cross-sectional contour deviating from the circular shape, e.g., a square or a polygon, produces the effect described here. For securing the electric motor axially, it may be expedient to provide fastening means, which prevent any axial displacement of the electric motor in the receptacles of the end block housing. However, this function may also be implemented through the receptacles for the auxiliary housing provided in the end block housing.

In a further embodiment, it is possible for the end block housing not to have any opening toward the atmosphere. This embodiment has the advantage that vacuum sealing of the vacuum chamber is greatly facilitated. In this case, it is possible to omit the constant evacuation of the interior of the end block housing, which is customary and essential with the known drive end blocks. All that is necessary is a current feed-through for power supply to the electric motor.

In addition, it is possible to provide for the electric motor to be a servo motor and/or a brushless direct current motor.

The embodiment of the motor may also be such that the stator is on the inside and the rotor is on the outside. The motor would then be designed as an exterior rotor or bell motor. In this case, there is a bearing only directly on the rotary feed-through, such that this bearing absorbs all the tilting moments and bearing forces.

BRIEF DESCRIPTION OF DRAWING FIGURES

Figure 2:
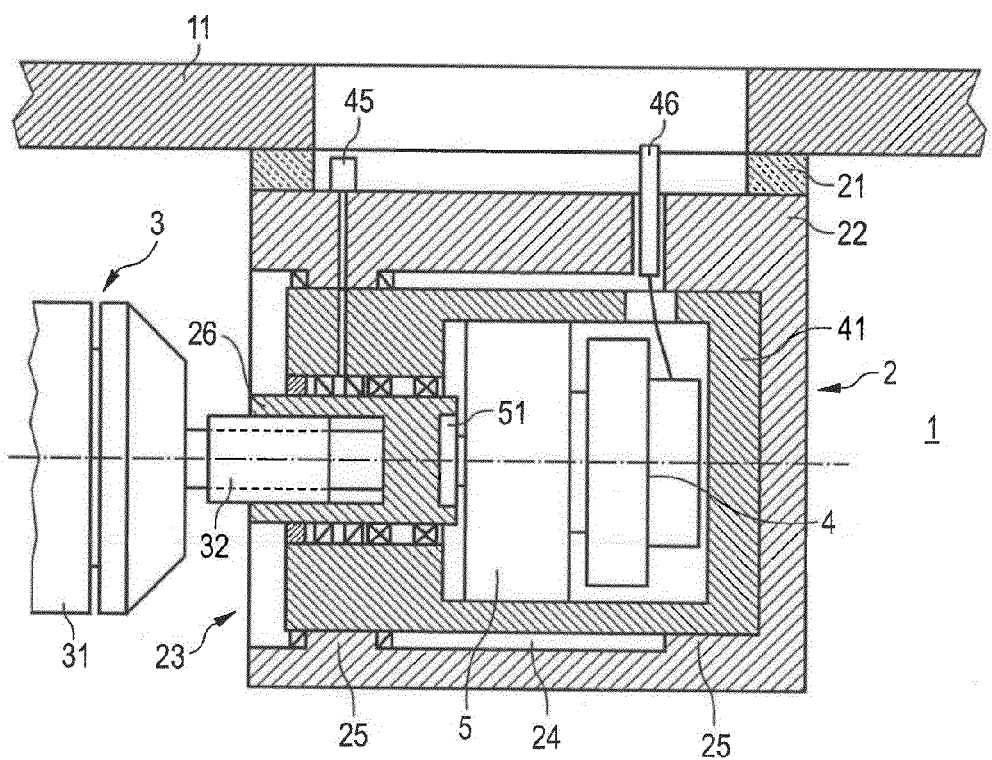

The proposed drive end block is explained in greater detail below on the basis of exemplary embodiments and the respective drawings, in which FIG. 1 shows a longitudinal section through a first exemplary embodiment, and FIG. 2 shows a longitudinal section through a second exemplary embodiment of the proposed drive end block.

DETAILED DESCRIPTION

FIG. 1 shows a first exemplary embodiment of a drive end block in which the electric motor 4 is arranged inside the end block housing 22 and is coaxial with the drive shaft 26. In a vacuum chamber 1 a drive end block 2, to which is attached a rotating target 3 is arranged in a vacuum chamber 1, said target having a target tube 31 and a connecting piece 32, a magnet system (not visible in the drawing) being arranged in the interior of the target tube 31.

The drive end block 2 is detachably attached to a chamber wall 11 of the vacuum chamber 1 by means of an insulation element 21. The drive end block 2 comprises an end block housing 22 with an opening 23, which faces the interior of the vacuum chamber 1 and forms a hollow space 24. Two receptacles 25 for a drive unit corresponding to the cross-sectional contour of the auxiliary housing 41 of the drive unit are provided in this hollow space 24, so that the drive unit can be inserted into the hollow space 24 through the opening 23 in a twist-proof manner.

The drive unit in the exemplary embodiment comprises the auxiliary housing 41, the drive shaft 26 and the electric motor 4, which has a stator 42 and a rotor 43. The stator 42 and the rotor 43 of the electric motor 4 are arranged directly in the auxiliary housing 41, so that the electric motor 4 does not require a separate motor housing.

The auxiliary housing 41 consists of electrically insulating material. The stator 42 and the rotor 43 of the electric motor 4 are arranged therein, with the rotor 43 being arranged on the motor shaft 44, which therefore at the same time comprises the drive shaft 26 of the drive end block 2 and is rotatably mounted in the auxiliary housing 41 at both ends. The rotor 43 of the electric motor 4 is mounted directly in the auxiliary housing 41 in this exemplary embodiment so that the auxiliary housing 41 of the drive unit at the same time constitutes the motor housing of the electric motor 4. The end of the drive shaft 26 protruding through the opening 23 in the end block housing 22 into the interior of the vacuum chamber 1 is designed to receive and transfer torque to the connecting piece 32 of the rotating target 3.

This end of the drive shaft 26 is rotatably mounted and sealed in the auxiliary housing 41 at the same time. In the area between two seals, a channel 45 opens, serving to connect a vacuum pump and therefore opening outside of the vacuum chamber 1. The power supply of the electric motor 4 is provided via a plug connector 46, which also ends outside of the vacuum chamber 1.

FIG. 2 shows a second exemplary embodiment of a drive end block in which the electric motor 4 is arranged inside the end block housing 22 and coaxially with the drive shaft 26. A drive end block 2, on which is attached a rotating target 3 having a target tube 31 and a connecting piece 32, is arranged in a vacuum chamber 1, such that a magnet system (not visible in the drawing) is arranged in the interior of the target tube 31.

The drive end block 2 is detachably mounted on a chamber wall 11 of the vacuum chamber 1 by means of an insulation element 21. The drive end block 2 comprises an end block housing 22 with an opening 23, which faces the interior of the vacuum chamber 1 and forms a hollow space 24. Two receptacles 25 for a drive unit are provided in this hollow space 24, corresponding to the cross-sectional contour of the auxiliary housing 41 of the drive unit, so that the drive unit can be inserted through the opening 23 into the hollow space 24 in a twist-proof manner.

In the exemplary embodiment, the drive unit comprises the auxiliary housing 41, the drive shaft 26 and the electric motor 4 as well as a gear 5 arranged between the electric motor 4 and the drive shaft 26, connected at one end to the electric motor 4 and at the other end to the drive shaft 26 via a coupling 51. In this exemplary embodiment, the stator and the rotor of the electric motor 4 are accommodated in a separate motor housing and therefore are not directly visible in the drawing.

The auxiliary housing 41 consists of electrically insulating material in which the drive shaft 26 of the drive end block 2 is rotatably mounted. The end of the drive shaft 26 protruding through the opening 23 in the end block housing 22 into the interior of the vacuum chamber 1 is designed to receive and transfer the torque to the connecting piece 32 of the rotating target 3.

This end of the drive shaft 26 is rotatably mounted and sealed at the same time in the auxiliary housing 41. In the area between the two seals, a channel 45 opens, which serves to connect a vacuum pump and therefore opens in the area between two seals outside of the vacuum chamber 1. The power supply to the electric motor 4 is provided via a plug connector 46, which also ends outside of the vacuum chamber 1.

We claim:

1. A drive end block for a magnetron arrangement with a rotating target arranged in a vacuum chamber, comprising an end block housing situated entirely beyond an end of the target within the vacuum chamber and having a rotatably mounted drive shaft arranged in the end block housing and accessible at an end from outside of the end block housing for connection to the rotating target and adapted at an end inside the end block housing for introduction of a torque, and an electric motor comprising a stator and a rotor for creating the torque, wherein the electric motor is arranged inside the end block housing and rotates the target.

2. The drive end block according to claim 1, wherein the electric motor is arranged coaxially with the drive shaft.

3. The drive end block according to claim 2, wherein the torque is transferred directly to the drive shaft.

4. The drive end block according to claim 1, further comprising a gear arranged between the electric motor and the drive shaft.

5. The drive end block according to claim 4, wherein the gear is a planetary gear.

6. The drive end block according to claim 1, wherein the electric motor is arranged in an auxiliary housing made of a material that is not electrically conductive and the drive shaft is rotatably mounted in the auxiliary housing.

7. The drive end block according to claim 6, wherein the rotor of the electric motor is arranged directly on the drive shaft so that the drive shaft is at the same time a motor shaft of the electric motor.

8. The drive end block according to claim 6, wherein the stator of the electric motor is arranged directly in the auxiliary housing, so that the auxiliary housing is a housing of the electric motor at the same time.

9. The drive end block according to claim 6, wherein the auxiliary housing is mounted without additional fastening means in a rotationally secure manner in a receptacle in the end block housing.

10. The drive end block according to claim 1, wherein the end block housing does not have an opening to the atmosphere.

11. The drive end block according to claim 1, wherein the electric motor comprises a servo motor.

12. The drive end block according to claim 1, wherein the electric motor comprises a brushless direct current motor.

13. The drive end block according to claim 1, wherein the end block housing is mounted to an interior chamber wall of the vacuum chamber by an insulation element.

* * * * *